United States Patent
Liou et al.

(10) Patent No.: US 10,763,175 B2
(45) Date of Patent: *Sep. 1, 2020

(54) SEMICONDUCTOR DEVICE AND METHOD FOR FABRICATING THE SAME (71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/109,667

(22) Filed: Aug. 22, 2018

(65) Prior Publication Data
US 2018/0366374 A1 Dec. 20, 2018

Related U.S. Application Data (60) Continuation of application No. 15/604,675, filed on May 25, 2017, now Pat. No. 10,090,203, which is a (Continued)

(30) Foreign Application Priority Data
May 7, 2015 (TW) .............................. 104114550 A (51) Int. Cl.
H01L 21/82 (2006.01)
H01L 21/8234 (2006.01)
H01L 21/308 (2006.01)
H01L 27/088 (2006.01)
H01L 29/06 (2006.01)
H01L 29/78 (2006.01)
H01L 29/66 (2006.01)

(52) U.S. Cl.
CPC .. H01L 21/823431 (2013.01); H01L 21/3081 (2013.01); H01L 21/3085 (2013.01); H01L 27/0886 (2013.01); H01L 29/0649 (2013.01); H01L 29/0688 (2013.01); H01L 29/66795 (2013.01); H01L 29/785 (2013.01)

(58) Field of Classification Search
None
See application file for complete search history.

(56) References Cited

U.S. PATENT DOCUMENTS 7,202,148 B2 4/2007 Chen et al.
7,820,550 B2 10/2010 Nyhus et al.
(Continued)

Primary Examiner — Benjamin P Sandvik
(74) Attorney, Agent, or Firm — Winston Hsu (57) ABSTRACT A semiconductor device and a method of forming the same, the semiconductor device includes a substrate, a plurality of fin shaped structures and an insulating layer. The substrate has a fin field-effect transistor (finFET) region, a first region, a second region and a third region. The first region, the second region and the third region have a first surface, a second surface, and a third surface, respectively, where the first surface is relatively higher than the second surface and the second surface is relatively higher than the third surface. The fin shaped structures are disposed on a surface of the fin field-effect transistor region. The insulating layer covers the first surface, the second surface and the third surface.

10 Claims, 12 Drawing Sheets

Related U.S. Application Data continuation of application No. 15/190,209, filed on Jun. 23, 2016, now Pat. No. 9,679,816, which is a division of application No. 14/793,692, filed on Jul. 7, 2015, now Pat. No. 9,406,521.

(56) References Cited

U.S. PATENT DOCUMENTS

| | | |
|---|---|---|
| 7,856,613 B1 | 12/2010 | Weling et al. |
| 7,883,834 B2 | 2/2011 | Hagiwara |
| 8,142,986 B2 | 3/2012 | Sim et al. |
| 8,158,476 B2 | 4/2012 | Tran et al. |
| 8,216,947 B2 | 7/2012 | Lee et al. |
| 8,441,074 B2 | 5/2013 | Rachmady |
| 8,846,490 B1 | 9/2014 | Shieh |
| 9,281,208 B2 | 3/2016 | Kim |
| 9,406,521 B1 | 8/2016 | Liou |
| 9,449,971 B2 | 9/2016 | Ting |
| 2013/0045580 A1 | 2/2013 | Cho |
| 2013/0221443 A1 | 8/2013 | Lin |
| 2013/0273711 A1 | 10/2013 | Liu |
| 2013/0277720 A1 | 10/2013 | Kim et al. |
| 2013/0277759 A1 | 10/2013 | Chen et al. |
| 2015/0054089 A1* | 2/2015 | Hong ............... H01L 21/762 257/401 |
| 2015/0069528 A1 | 3/2015 | Chiang et al. |
| 2015/0091127 A1* | 4/2015 | Lee ............... H01L 29/0649 257/506 |
| 2015/0145068 A1 | 5/2015 | Chen |
| 2015/0255299 A1 | 9/2015 | Cantone |

* cited by examiner

SEMICONDUCTOR DEVICE AND METHOD FOR FABRICATING THE SAME

CROSS REFERENCE TO RELATED APPLICATIONS

This application is a Continuation of application Ser. No. 15/604,675 filed May 25, 2017 which is a Continuation of application Ser. No. 15/190,209 filed Jun. 23, 2016 which is a Divisional of application Ser. No. 14/793,692 filed Jul. 7, 2015, and included herein by reference.

BACKGROUND OF THE INVENTION

1. Field of the Invention

The invention relates to a semiconductor device and a method of forming the same, and more particularly, to a semiconductor device having surfaces in different heights which is formed through multiple fin cut processes, and a method of forming the same.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (finFET) have three-dimensional structure, not only capable of increasing the contact to the gate but also improving the controlling of the channel region, such that the non-planar FETs have replaced the planar FETs and become the mainstream of the development.

The current method of forming the fin field effect transistors is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the fin field effect transistors also faces more challenges and limitations. For example, the fabricating process is limited by current mask and lithography techniques, such that it has problems to precisely define the position of the fin structure, or to precisely control the etching time, thereby leading to fin collapse or over-etching issues, and seriously affecting the efficiency of the fin structure.

SUMMARY OF THE INVENTION

It is one of the primary objectives of the present invention to provide a semiconductor device and a method of forming the same, in which, a method of using multiple fin cut processes is carried out to form a semiconductor device having surfaces in different heights, to obtain a more reliable semiconductor device.

To achieve the purpose described above, one embodiment of the present invention provides a semiconductor device including a substrate, a plurality of fin shaped structures and an insulating layer. The substrate has a fin field effect transistor region, a first region and a second region. The first region and the second region extend along two different directions and have a first surface and a second surface respectively, wherein the first surface is relatively higher than the second surface. The fin shaped structures are disposed on a surface of the fin field effect transistor region. The insulating layer covers the first surface, the second surface, and a bottom portion of the fin shaped structures, to form a first shallow trench isolation (STI) in the first region, a second STI in the second region and a third STI in the finFET region, wherein the first STI, the second STI and the third STI have different depths.

To achieve the purpose described above, another embodiment of the present invention provides a method of forming a semiconductor device including following steps. First of all, a substrate having a fin field effect transistor region, a first region and a second region is provided, wherein the first region and the second region extend along two different directions and have a first surface and a second surface respectively, the first surface is higher than the second surface. Then, a plurality of fin shaped structures is formed on a surface of the fin field effect transistor region. Finally, an insulating layer is formed to cover the first surface, the second surface, and a bottom portion of the fin shaped structures, thereby forming a first shallow trench isolation (STI) in the first region, a second STI in the second region, and a third STI in the finFET region, wherein the first STI, the second STI and the third STI have different depths.

The semiconductor device and the forming method thereof in the present invention conducts two or more than two fin cut processes after fin shaped structures are formed on the substrate, so that, the semiconductor device may have dishing surfaces in different horizontal heights, within different regions of the substrate. More specifically, the first fin cut process of the present invention preferably forms the first surface having a height in one region, the second fin cut process of the present invention preferably forms the second surface having another height in another region, and further reduces the height of the first surface in a part of the aforementioned region to form the third surface having the least height. In this way, the substrate may obtain at least three dishing surfaces in different horizontal heights. By using the aforementioned approach it may be desirable to prevent unwanted impurities grown on the substrate and damage caused to the entire device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
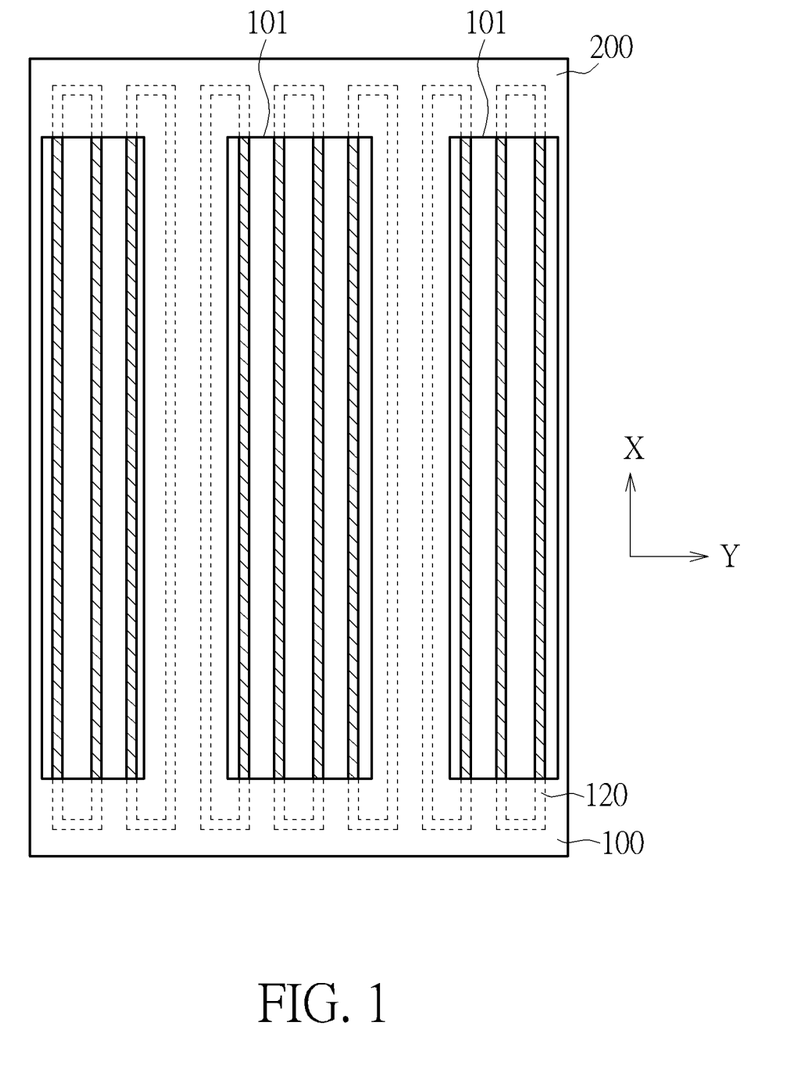
FIG. 1 to FIG. 7 are schematic diagrams illustrating a method of forming a semiconductor device according to a first embodiment of the present invention.
Figure 2:
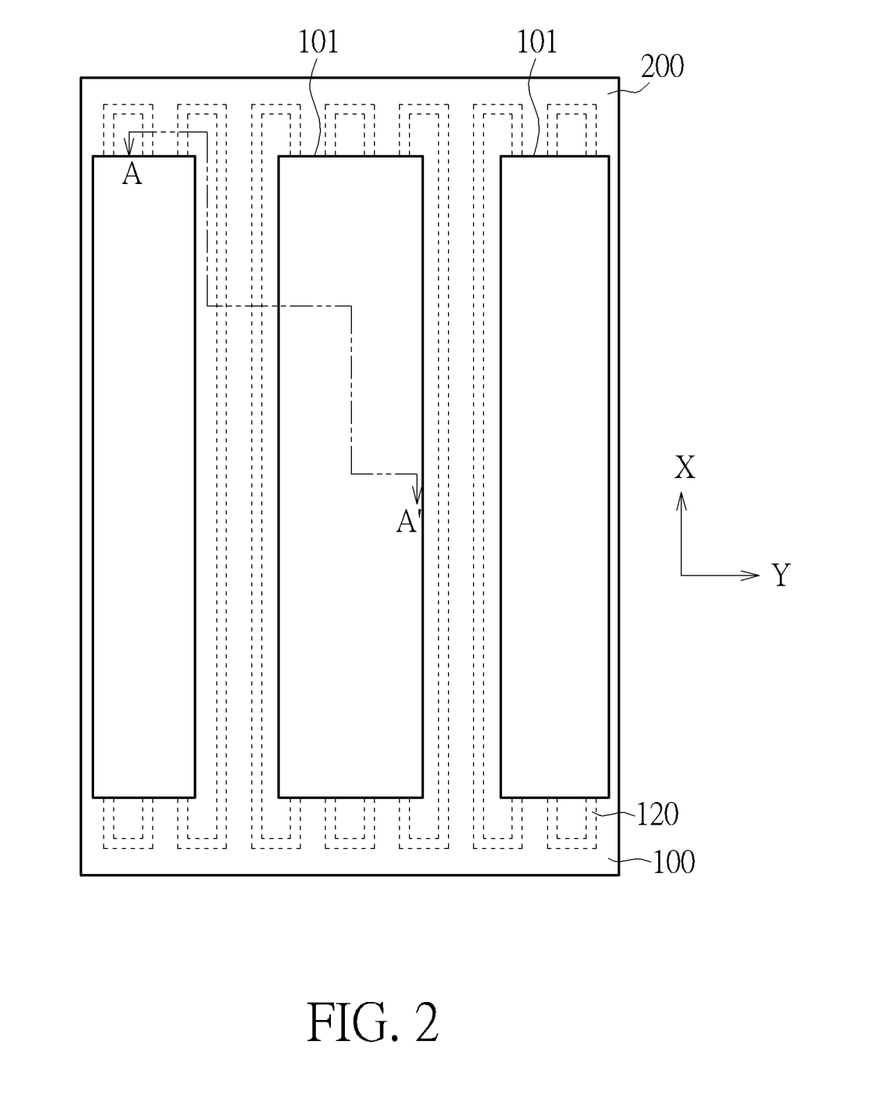
Figure 3:
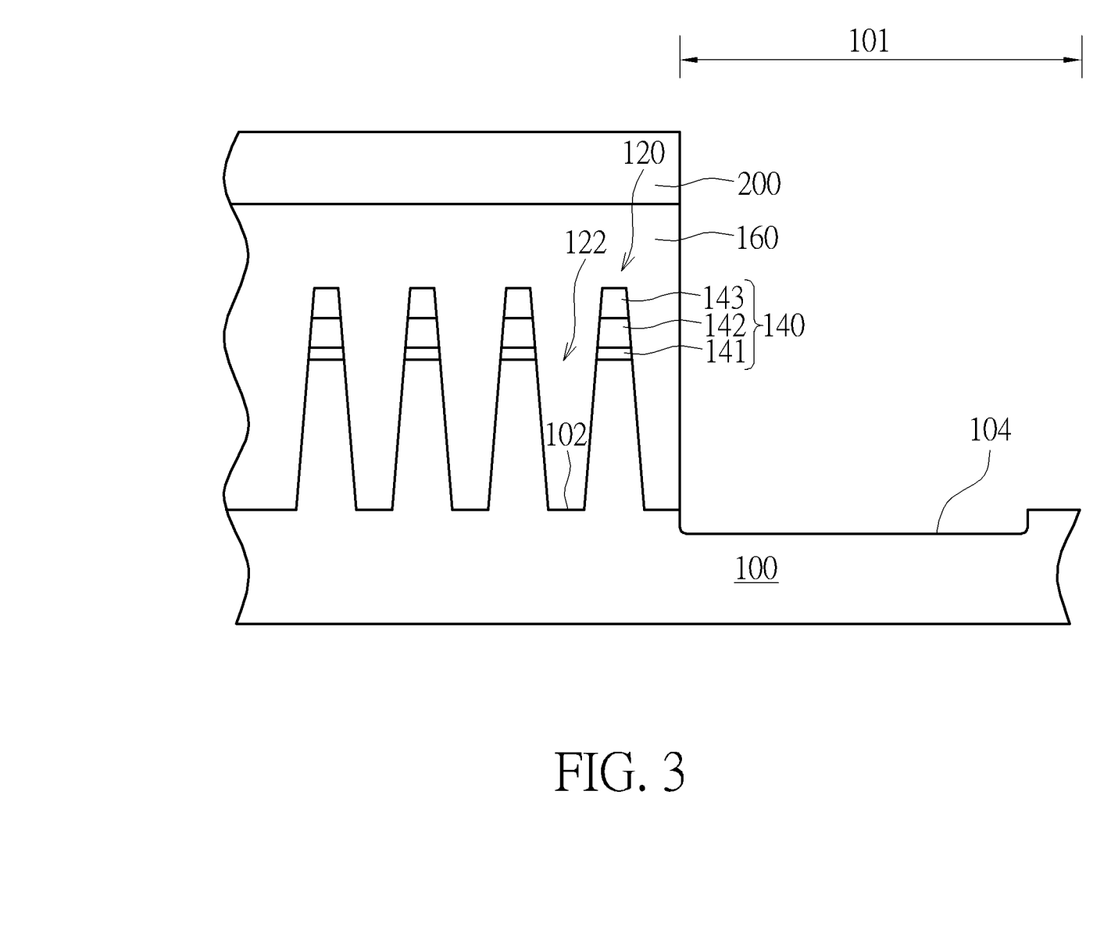
Figure 4:
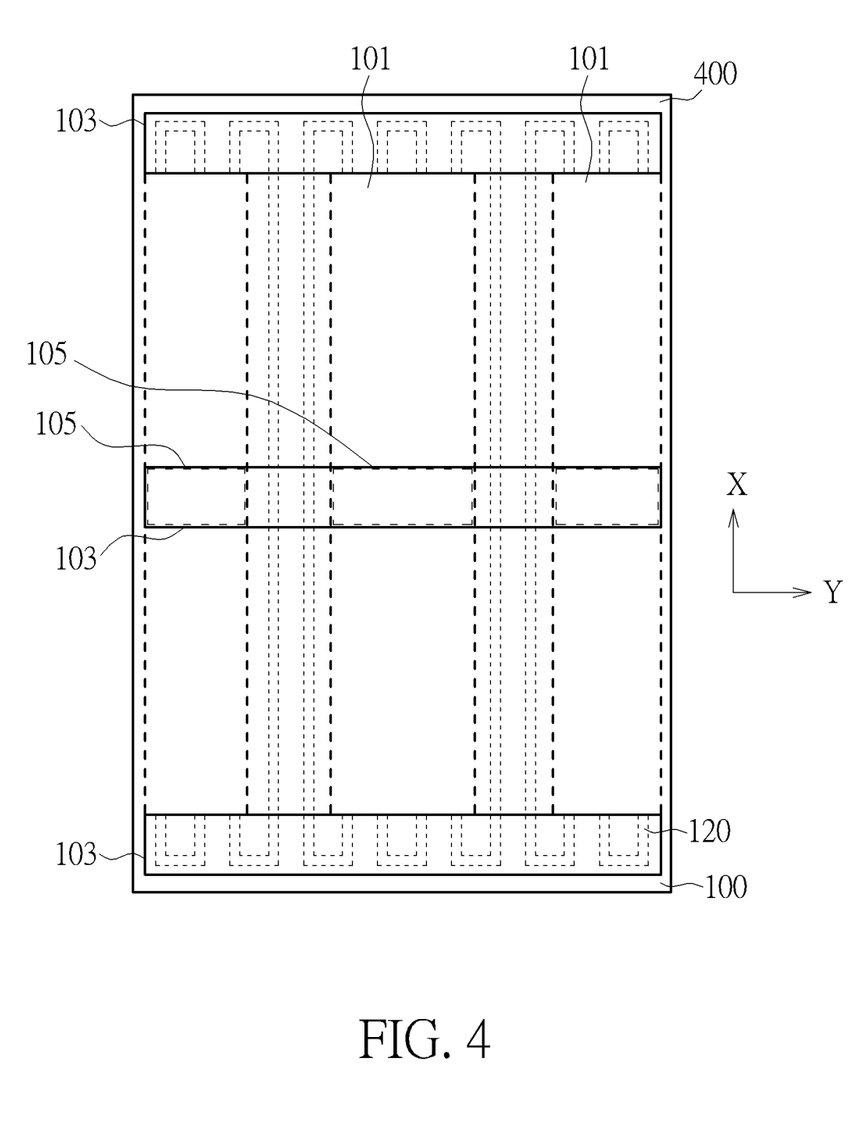
Figure 5:
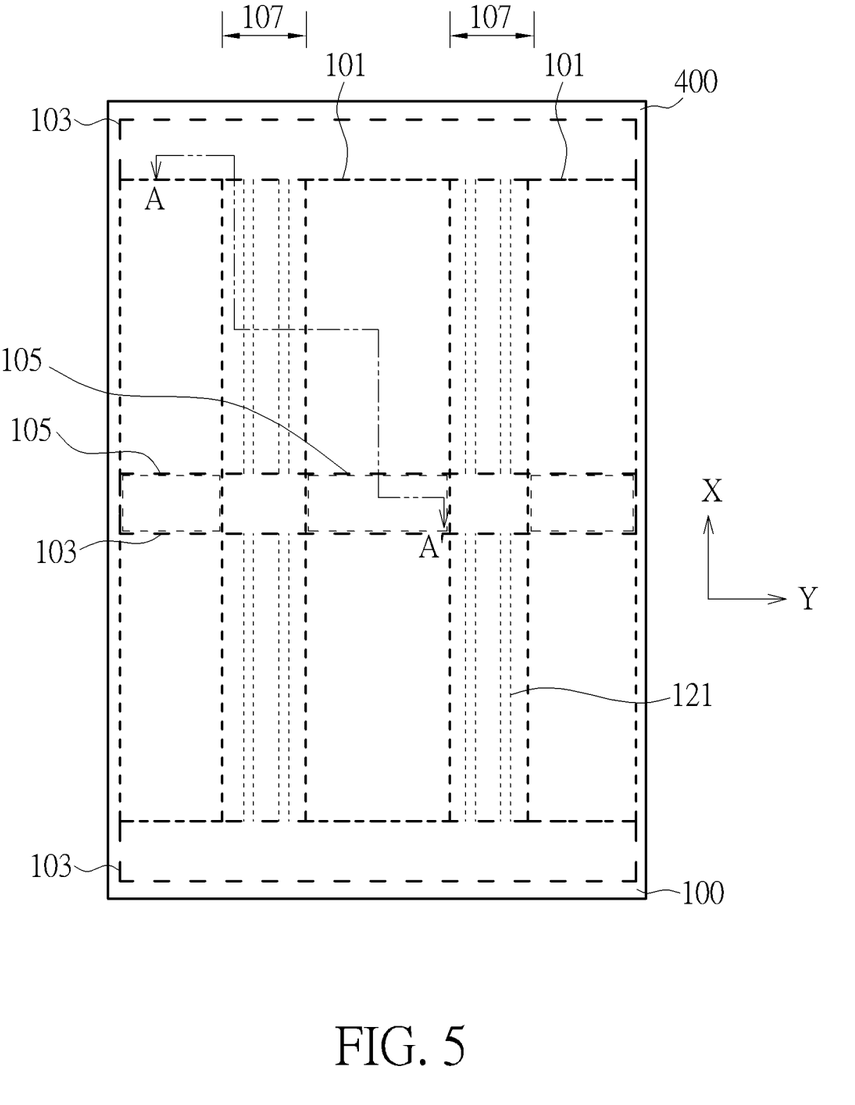
Figure 6:
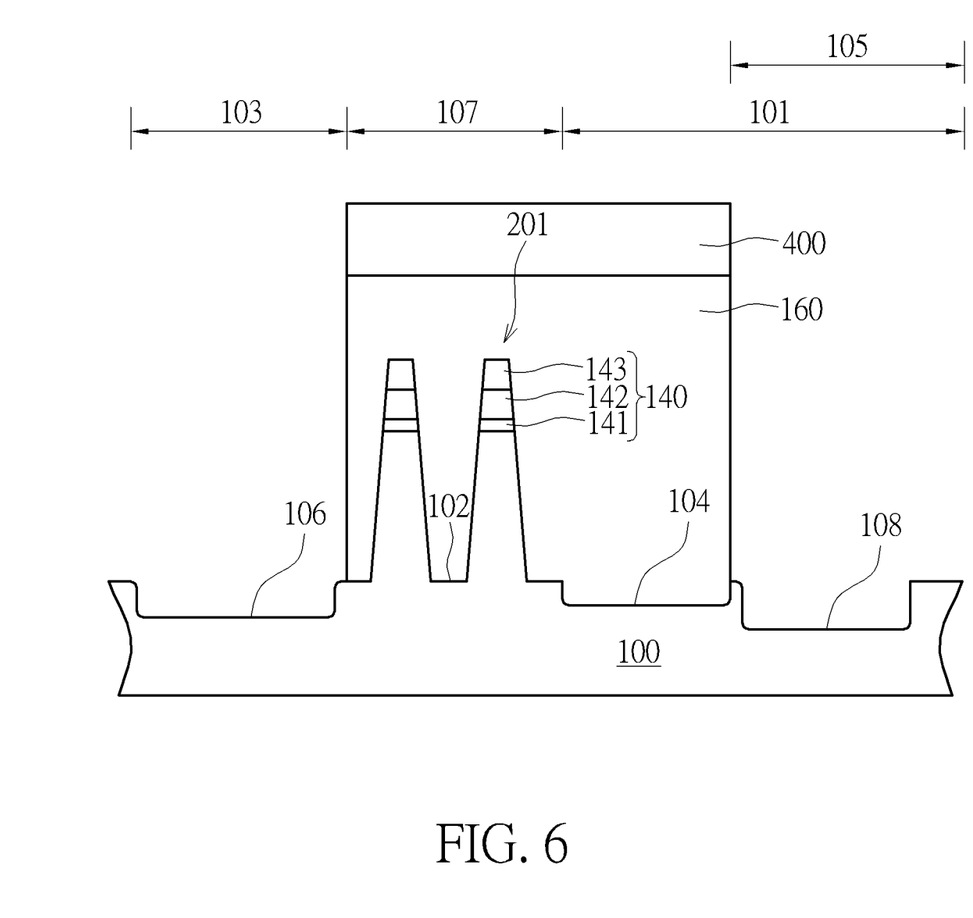

Please refer to FIG. 1 to FIG. 7, which are schematic diagrams illustrating a method of forming a semiconductor device according to the first embodiment of the present invention, wherein FIG. 1, FIG. 2, FIG. 4 and FIG. 5 are schematic top views of the semiconductor device in forming steps, and FIG. 3 and FIG. 6 are cross-sectional schematic views taken along the cross line A-A' in FIG. 2 and FIG. 5. First of all, as shown in FIG. 1, a substrate 100 is provided. The substrate 100 may include a semiconductor substrate, such as a silicon substrate or a silicon-containing substrate, and a plurality of fin shaped structures 120 is formed on a surface 102 of the substrate 100.

In an example of bulk silicon substrate, the fin shaped structures 120 may be formed preferably through a sidewall image transfer (SIT) process. The process may include forming a plurality of patterned sacrificial layers (not shown in the drawings) on the substrate 100 by using a photolithography and an etching process, performing a depositing and an etching processes sequentially to form a spacer (not shown in the drawings) at sidewalls of each of the patterned sacrificial layers, and then removing the patterned sacrificial layers and performing another etching process by using the spacer as a mask, thereby transferring the patterns of the spacer to a monolayered or a multilayered patterned mask 140, for example a composite mask structure consisting of a silicon oxide layer 141, a silicon nitride layer 142 and a silicon oxide layer 143. After that, another etching process is performed to transfer the patterns of the patterned mask 140 to the substrate 100 underneath, and to form a plurality of shallow trenches 122 as shown in FIG. 3 and to simultaneously define each fin shaped structure 120 and the surface 102 therebetween. It is worth noting that, the fin shaped structure 120 has a closed rectangular frame, as shown in FIG. 1.

Alternatively, in another embodiment, the formation of the fin shaped structures 120 may also be accomplished by first forming a patterned hard mask (not shown in the drawings) on the substrate 100, and then performing an epitaxial process on the exposed substrate 100 through the patterned hard mask to form a semiconductor layer (not shown in the drawings), such as silicon or silicon germanium layer. The semiconductor layer may then be used as the corresponding fin shaped structure.

Next, a first fin cut process may be carried out, for example including forming a patterned mask, such as a photoresist layer 200 having at least one opening pattern as shown in FIG. 1, on the substrate 100, to cover the majority of the fin shaped structures 120 and to expose a portion of the fin shaped structures 120 in a first region 101 of the substrate 100. Then, a first etching process is performed, such as a dry etching, a wet etching process or a sequentially performed dry and wet etching process, to entirely remove the fin shaped structures 120 in a first region 101 and a portion of the substrate 100 in a first region 101, thereby forming a surface 104 in the first region 101 of the substrate 100, such as the dishing shaped surface 104 shown in FIG. 3, which is lower than the surface 102 and sunken downwardly. In one embodiment, the opening pattern of the photoresist layer 200 preferably extends along a direction X parallel to the extending direction of the fin shaped structures 120, and exposes an area having a length of two times greater than the pitch of the fin shaped structures 120 in a direction Y. Thus, at least one of the fin shaped structures 120 having the closed rectangular frame may be cut into fragments, so that, the fin shaped structures in "U" shaped or battlement shaped may be formed as shown in FIG. 2. However, the present invention is not limited thereto, and in another embodiment, other kinds of patterned masks (not shown in the drawings) may be formed optionally. For example, a plurality of photoresist layers (not shown in the drawings) parallel along the direction X and spaced from each other may be formed, or a photoresist layers having an opening patterned extended to other directions (not shown in the drawings) may be formed, so as to cut the fin shaped structures 120 into other shapes (not shown in the drawings).

It is worth noting that, in order to form the dishing shaped surface 104 which is sunken downwardly, a sacrificial material may be filled between each of the fin shaped structures 120 before the first etching process, wherein the sacrificial material preferably has similar etching selectivity to that of the fin shaped structures 120. For example, a planarized organic dielectric layer (ODL) 160 is formed on the substrate 100, such that, the OLD 160 may completely cover on the fin shaped structure 120 having the closed rectangular frame and fill in the shallow trenches 122 therebetween. In this way, while the first etching process is performed, the fin shaped structures 120, the ODL 160 and the portion of the substrate 100 in the first region 101 may all be synchronously and equally removed, thereby forming the surface 104 in a smooth dishing shaped in the first region 101 of the substrate 100, as shown in FIG. 3. However, the method of removing the fin shaped structure 120 and forming the smooth surface is not limited to the above-mentioned steps but may include other methods, which are well known by one skilled in the arts, and are not described in detail hereafter.

After the photoresist layer 200 and the OLD 160 are completely removed, a second fin cut process is carried out. As shown in FIG. 4, another patterned mask, such as a photoresist layer 400 having at least one opening pattern, is formed to cover a portion of the rest of the fin shaped structures 120, and to expose a portion of the fin shaped structures 120 disposed in the second region 103 of the substrate 100. Then, a second etching process is performed, such as a dry etching, a wet etching process or a sequentially performed dry and wet etching process, to entirely remove the fin shaped structures 120 in a second region 103 and a portion of the substrate 100 in a second region 103, thereby forming a surface 106 on the substrate 100 in the second region 103, such as the dishing shaped surface 106 shown in FIG. 6, which is lower than the surfaces 102, 104 and sunken downwardly. In one embodiment, the opening pattern of the photoresist layer 400 preferably extends along the direction Y perpendicular to the extending direction of the fin shaped structures 120, and exposes an area having a length of two times greater than the pitch of the fin shaped structures 120 in the direction Y. Thus, the rest of the fin shaped structures 120 may be cut to form a plurality of fin shaped structures 121 in strip patterns and isolated from each other, as shown in FIG. 5. However, the patterned mask is not limited to the aforementioned type, and in another embodiment, patterned masks in other kinds or shapes (not shown in the drawings), may be formed optionally. For example, a plurality of photoresist layers (not shown in the drawings) parallel along the direction Y and spaced from each other may be formed.

Likewise, before the second etching process is performed, a sacrificial material having similar etching selectivity to that of the fin shaped structures 120, such as the ODL 160, may be filled between each of the fin shaped structures 120. In this way, while the second etching process is performed, the fin shaped structures 120, the ODL 160 and the portion of the substrate 100 in the second region 103 may all be synchronously and equally removed, thereby forming the surface 106 in a smooth dishing shaped on the substrate 100 in the second region 103, as shown in FIG. 6.

Further in view of FIGS. 5-6, in the present embodiment, the fin shaped structures 121 in strip patterns are formed in a region 107 of the substrate 100, adjacent to the first region 101 and the second region 103. The region 107 is preferably configured to form a fin field effect transistor (finFET) region requested by practical element, so that, some semiconductor elements, such as gate structure, may be formed subsequently on the fin shaped structure 121 in the region 107 according to the practical requirements, but is not limited thereto. Furthermore, it is noted that, the quantity of the fin-shaped structures 121 is not limited to the ones disclosed in the present embodiment, but may be adjusted according to the demands of the process.

It is also worth noting that, in the second etching process, a relatively greater amount of substrate 100 in the second region 103 is optionally removed after the fin shaped structures 120 in the second region 103 is completely removed, in comparison with the first etching process, so that, the dishing-shaped surface 106 lower than the surface 104 and sunken downwardly may be formed, as shown in FIG. 6. Also, since the opening pattern of the photoresist layer 200 and the opening pattern of the photoresist layer 400 extends respectively along the direction X and the direction Y, the third region 105 of substrate 100 is repeatedly etched during the two etching processes, thereby forming a lower surface, such as a dishing-shaped surface 108 even lower than the surface 106 and sunken downwardly, as shown in FIG. 6. In other words, the first region 101 and the second region 103 are overlapped at the third region 105, and the third region 105 of the substrate 100 may suffer from two times of the etching process (including the first etching process and the second etching process), to form the surface 108 lower than the surfaces 104, 106. In one embodiment, an altitude difference between the surface 108 in the third region 105 and the surface 102 in the region 107 is substantially two or more than two times greater than an altitude difference between the surface 104 in the first region 101 and the surface 102 in the region 107, but is not limited thereto.

However, although firstly performing the etching process through the photoresist layer 200 extended along the direction X parallel to the extending direction of the fin shaped structures 120, and further performing another etching process through the photoresist layer 400 extended along the direction Y perpendicular to the extending direction of the fin shaped structures 120 in the present embodiment, the method of performing the fin cut process of the present invention is not limited thereto, and may include other processes. For example, in one embodiment of the present invention, the etching process may also be firstly performed through the photoresist layer 400 extended along the direction Y perpendicular to the extending direction of the fin shaped structures 120, cutting the fin shaped structures 120 having the closed rectangular frame into a plurality of strip-shaped fin shaped structures isolated from each other (not shown in the drawings), and another etching is then performed through the photoresist layer 200 extended along the direction X parallel to the extending direction of the fin shaped structures 120. In another embodiment, the etching process may also be optionally performed through mesh-shaped opening patterns (not shown in the drawings) consisting of the photoresist layers 200, 400 simultaneously. Otherwise, a relatively greater amount of substrate 100 is optionally removed in the first etching process than that removed in the second etching process, thereby obtaining a surface (not shown in the drawings) formed in the first etching process lower than a surface (not shown in the drawings) formed in the second etching process; or the same amount of substrate 100 is removed in the two etching process, thereby obtaining surfaces (not shown in the drawings) formed in the first etching process and the second etching process with the same height.

Figure 7:
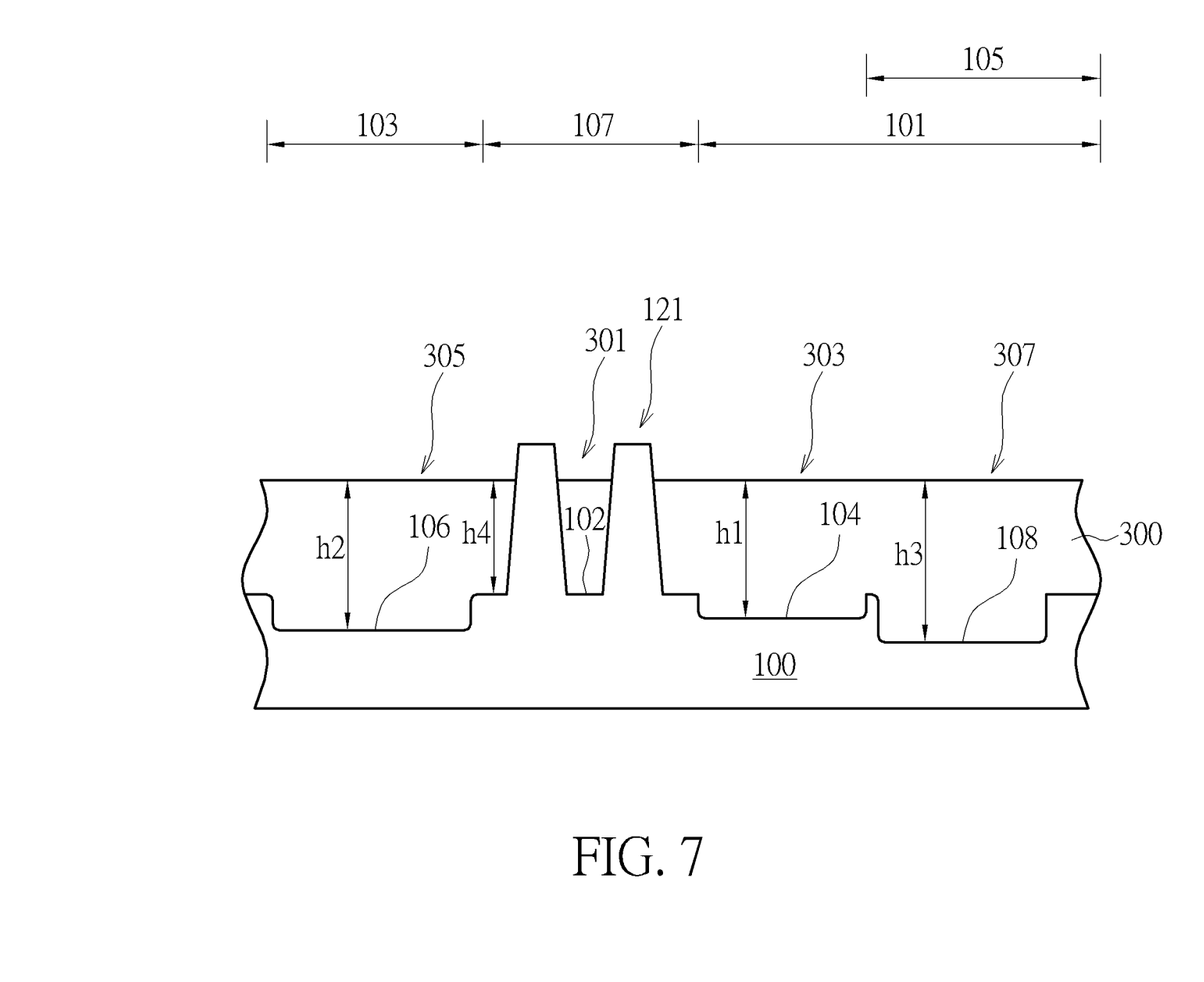

In the following, after the photoresist layer 400 and the ODL 160 are removed, an insulating material layer (not shown in the drawings) is formed on the substrate 100, for example, through a chemical vapor deposition (CVD) process, and then, a chemical mechanical polishing (CMP) process and an etching back process is performed to form an insulating layer 300 as shown in FIG. 7, such as including silicon oxide. Accordingly, a portion of the fin shaped structures 121 may protrude from the insulating layer 300, such that, a portion of the insulating layer 300 formed between the fin shaped structures 121 may be configured as a shallow trench isolation (STI) 301. Meanwhile, a portion of the insulating layer 300 formed on the surface 104 in the first region 101 may form a shallow trench isolation 303; a portion of the insulating layer 300 formed on the surface 106 in the second region 103 may form a shallow trench isolation 305; and a portion of the insulating layer 300 formed on the surface 108 in the third region 105 may form a shallow trench isolation 307. It is worth noting that, the surface 104 formed in the first region 101 is relatively higher than the surface 106 formed in the second region 103, and the surface 106 is relatively higher than the surface 108 formed in the third region 105, so that, the shallow trench isolation 303 may have a depth h1 less than a depth h2 of the shallow trench isolation 305, and the depth h2 of the shallow trench isolation 305 is less than a depth h3 of the shallow trench isolation 307. Also, the shallow trench isolation 301 may have the least depth h4 among other shallow trench isolations 303, 305, 307, as shown in FIG. 7, because all of the surfaces 104, 106, 108 are lower than the surface 102 formed in the fin field effect transistor region (namely, the region 107). In one preferred embodiment, a difference (h3−h4) between the depth h3 of the shallow trench isolation 307 and the depth h4 of the shallow trench isolation 301 is about two times greater than a difference (h1−h4) between the depth h1 of the shallow trench isolation 303 and the depth h4 of the shallow trench isolation 301.

Furthermore, in one embodiment, the patterned mask 140 may be removed selectively as shown in FIG. 7, while the chemical mechanical polishing process and the etching back process are performed, due to the structural characteristics of tri-gate transistor device formed subsequently. After that, a general semiconductor fabrication process may be carried out, to form a gate (not shown in the drawings) on the fin shaped structures 121, functioning as a tri-gate transistor device. However, the present invention is not limited thereto, and in another embodiment, the patterned mask 140 may also be optionally retained, or partially removed, so as to form a dual-gate transistor device. Also, in another embodiment, an in situ steam generation (ISSG) process or an atomic layer deposition (ALD) process may be firstly performed on exposed surfaces of the substrate 100 and the fin shaped structures 121, before the insulating layer 300 is formed, to uniformly form an interfacial layer (not shown in the drawings) thereon to function as a liner. The liner may include a monolayer structure or a multilayer structure, and preferably includes silicon oxide or suitable high dielectric constant materials, but is not limited thereto.

Through the above mentioned steps, the semiconductor device according to the first embodiment of the present invention is obtained. The method of the present invention utilizes different patterned masks to perform various fin cut processes, so that the fin shaped structures may have various surfaces with different horizontal heights. Precisely speaking, the method of the present embodiment uses the patterned masks having opening patterns which are perpendicular and overlap with each other, such that, a region of the substrate may be etched repeatedly, thereby forming three or more than three etching surfaces with different horizontal heights on the substrate relative to the surface with the fin shaped structure formed thereon. By using the aforementioned approach, it may be desirable to prevent unwanted impurities or dummy fin shaped structures grown on the substrate and damage caused to the entire device. Also, the semiconductor device may obtain various shallow trench isolations with different depths in the subsequent process of filling the insulating layer, and those shallow trench isolations may more effectively isolate two adjacent fin shaped structures from each other, thereby providing better element performance.

People in the art shall easily realize that the semiconductor device of the present invention is not limited to be formed through the aforementioned processes, and may also be formed through other forming methods. Thus, the following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
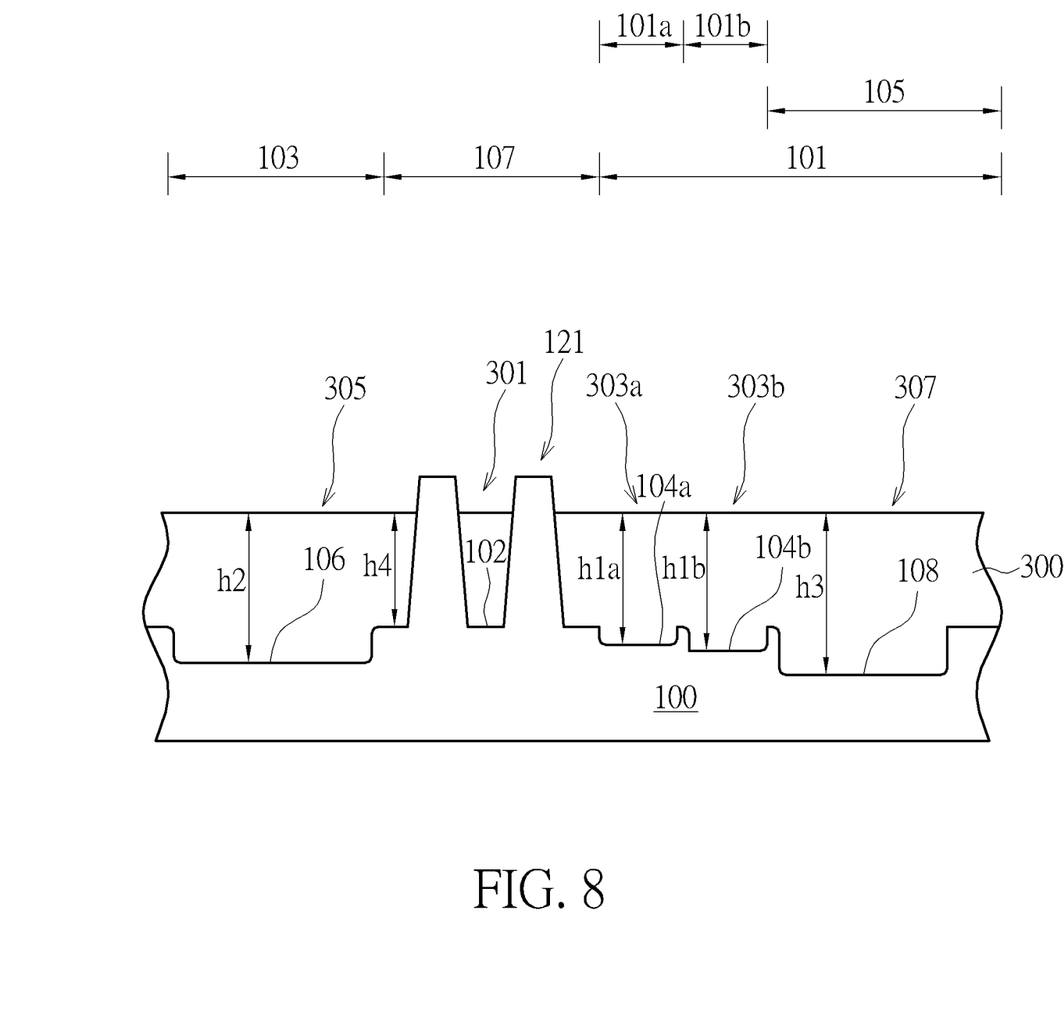
FIG. 8 is a schematic diagram illustrating a method of forming a semiconductor device according to a second embodiment of the present invention.

Please refer to FIG. 8, which is a schematic diagram illustrating a method of forming a semiconductor device according to the second embodiment of the present invention. The formal steps in the present embodiment are similar to those in the first embodiment, and which includes forming the fin shaped structures 121 on the substrate 100, and forming the surface 106 in the second region 103 and the surface 108 in the third region 105. However, the differences between the present embodiment and the aforementioned first embodiment are that, a double patterning process or a multiple patterning process may be used while removing the fin shaped structures 120 and the portion of the substrate 100 in the first region 101. In other words, in the present embodiment, the fin shaped structures 120 and a portion of the substrate 100 in a first part 101a of the first region 101, and the fin shaped structures 120 and a portion of the substrate 100 in a second part 101b of the first region 101 may be removed progressively, for example through a photolithography-etch-photolithography-etch (2P2E). Also, different amount of substrate 100 may be selectively removed in these two etchings, thereby forming surfaces 104a, 104b respectively in the first part 101a and the second part 101b of the first region 101, as shown in FIG. 8.

It is noted that, although the present embodiment is exemplified by forming a relatively higher surface 104a in the first part 101a than the surface 104b formed in the second part 101b (namely, in comparison with the substrate 100 in the first part 101a, a relatively greater amount of the substrate 100 in the second part 101b is removed during the etching process), the present invention is not limited thereto, and may include other methods according to the practical requirements. In this way, after forming the insulating layer 300 in the subsequent process, shallow trench isolations 303a, 303b are formed respectively in the first part 101a and the second part 101b of the first region 101, wherein the shallow trench isolation 303a may have a depth h1a less than a depth h1b of the shallow trench isolation 303b, as shown in FIG. 8.

Through the above mentioned steps, the semiconductor device according to the second embodiment of the present invention is obtained. The method of the present invention is accomplished by performing various fin cut processes with different patterned masks, and further performing a double patterning process or a multiple patterning process, so as to form four or more than four surfaces with different horizontal heights on the substrate relative to the surface with the fin shaped structure formed thereon. By using the aforementioned approach, it may be desirable to obtain semiconductor device with better element performance.

Figure 9:
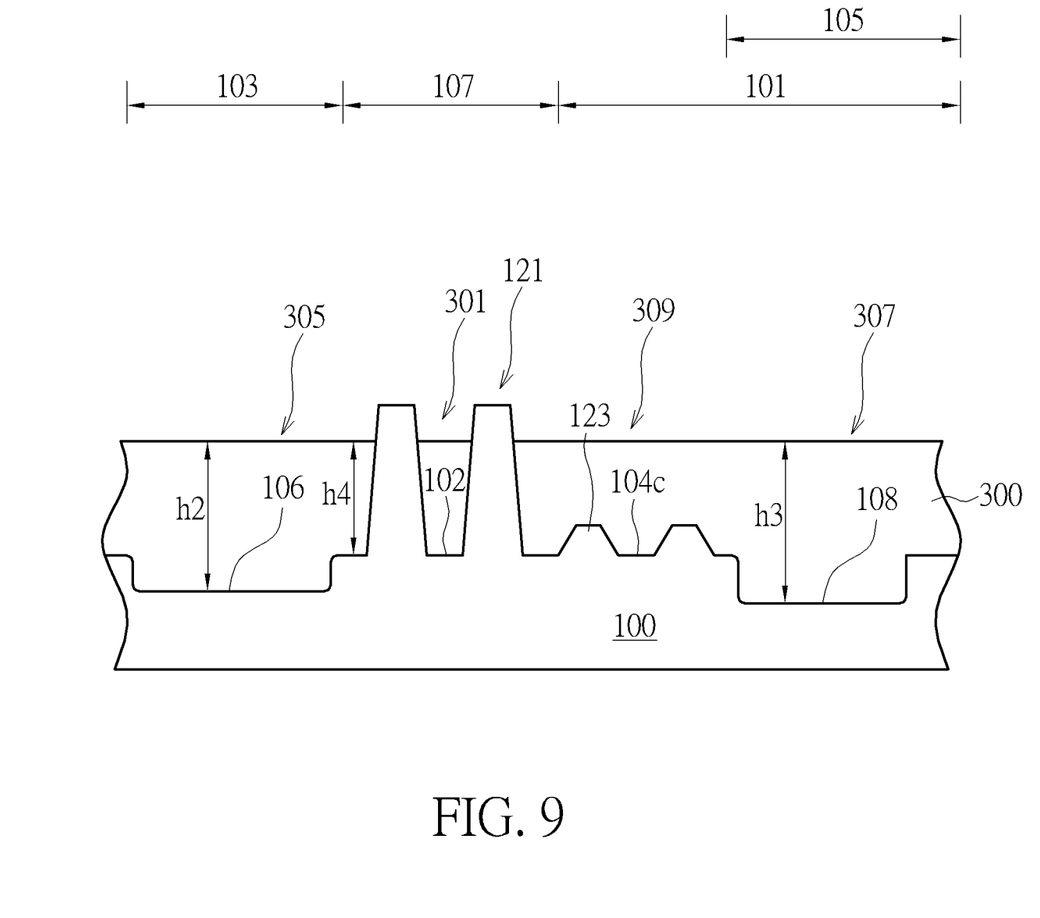
FIG. 9 is a schematic diagram illustrating a method of forming a semiconductor device according to a third embodiment of the present invention.

Please refer to FIG. 9, which is a schematic diagram illustrating a method of forming a semiconductor device according to the third embodiment of the present invention. The formal steps in the present embodiment are similar to those in the first embodiment, and which includes forming the fin shaped structures 121 on the substrate 100, and forming the surface 106 in the second region 103 and the surface 108 in the third region 105. However, the differences between the present embodiment and the aforementioned first embodiment are that, while etching the fin shaped structures 120 in the first region 101, only the fin shaped structures 120 formed in the first region 101 are partially removed, instead of removing the fin shaped structures 120 and the portion of the substrate 100 in the first region 101. In other words, while performing the etching process in the present embodiment, the sacrificial material having similar etching selectivity to that of the fin shaped structures 120 may not be filled between the fin shaped structures 120, so that, the exposed fin shaped structures 120 in the first region 101 may be etched directly. Otherwise, the sacrificial material having similar etching selectivity to that of the fin shaped structures 120 may still be filled between the fin shaped structures 120, and only the fin shaped structures 120 in the first region 101 is selectively etched, without removing any substrate 100 during the etching process. Thus, a plurality of bumps 123 having a lesser height relative to that of the fin shaped structures 121 (disposed in the fin field effect transistor region) may be formed in the first region 101, as shown in FIG. 9. Meanwhile, in the present embodiment, the substrate 100 in the first region 101 may have a surface 104a level with the surface 102 of the fin field effect transistor region (namely, the region 107), because the substrate 100 in the first region 101 is not etched. In this way, after forming the insulating layer 300 in the subsequent process, the insulating layer 300 may fully cover the bumps 123 formed in the first region 101, thereby forming a shallow trench isolation 309 in the first region 101, as shown in FIG. 9.

Through the above mentioned steps, the semiconductor device according to the third embodiment of the present invention is obtained. The method of the present invention is also accomplished by performing various fin cut processes with different patterned masks, so as to form various surfaces with different horizontal heights on the substrate. Also, in the present embodiment, the etching conditions are further adjusted to optionally form bumps having a lesser height than that of the fin shaped structures on the substrate. In this way, the insulating layer formed subsequently may be configured as the shallow trench isolation fully covering the bumps, thereby more effectively isolating two adjacent fin shaped structures from each other to obtain the semiconductor device with better element performance.

Figure 10:
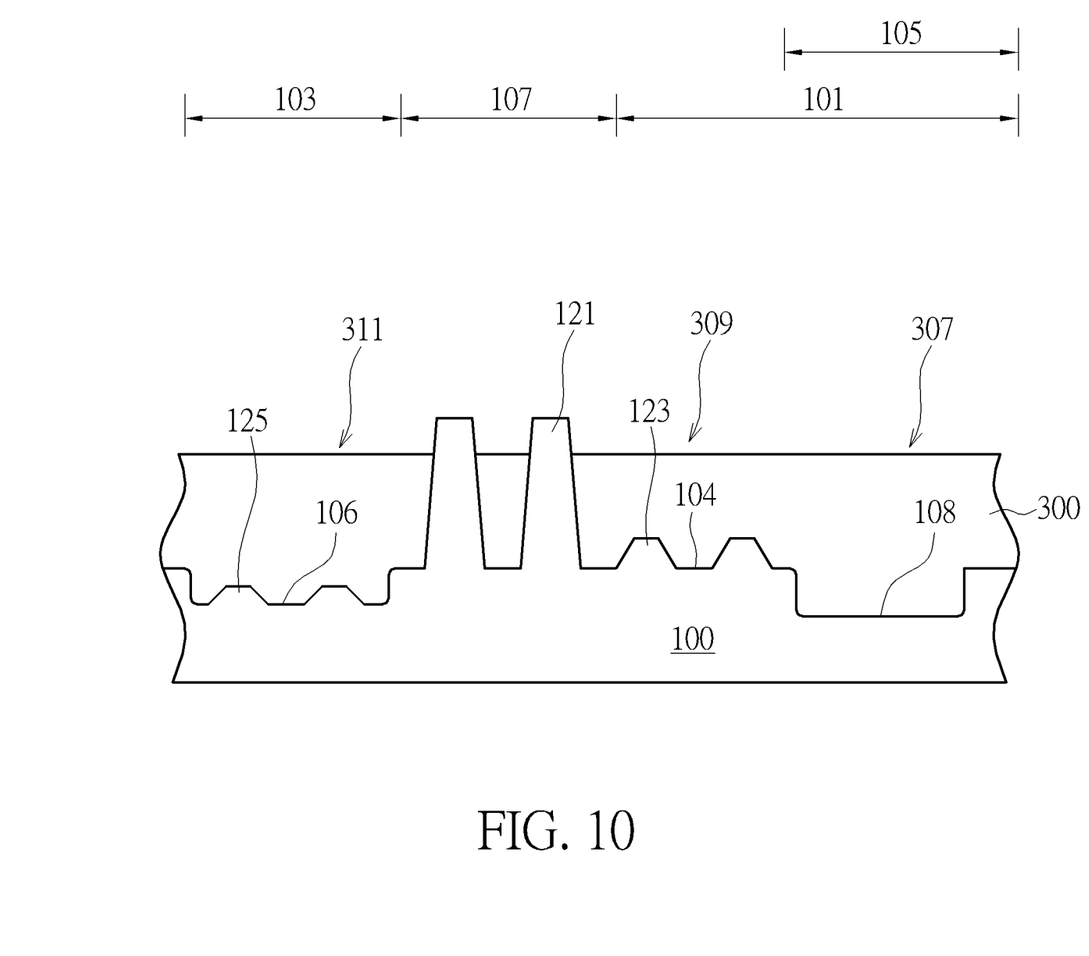
FIG. 10 is a schematic diagram illustrating a method of forming a semiconductor device according to a fourth embodiment of the present invention.

Please refer to FIG. 10, which is a schematic diagram illustrating a method of forming a semiconductor device according to the fourth embodiment of the present invention. The formal steps in the present embodiment are similar to those in the third embodiment, and which includes forming the fin shaped structures 121 on the substrate 100 in the fin field effect transistor region (namely, the region 107); forming the bumps in the first region 101; and forming the surface 108 in the third region 105. However, the differences between the present embodiment and the aforementioned first embodiment are that, while etching the fin shaped structures 120 in the second region 103, the fin shaped structure 120 and the portion of the substrate 100 in the second region 103 are isotropically etched, so that, the surface 106 lower than the surface 102 (formed in the fin field effect transistor region) and the surface 104c (formed in the first region 101) and a plurality of bumps 125 formed on the surface 106 are formed, as shown in FIG. 10. Also, after forming the insulating layer 300 in the subsequent process, the insulating layer 300 may fully cover the bumps 125 formed in the second region 103, thereby forming a shallow trench isolation 311 in the second region 103, as shown in FIG. 10.

Through the above mentioned steps, the semiconductor device according to the fourth embodiment of the present invention is obtained. The method of the present invention is also accomplished by performing various fin cut processes with different patterned masks, so as to form various surfaces with different horizontal heights on the substrate. Also, in the present embodiment, the etching conditions are further adjusted to optionally form bumps having a lesser height than that of the fin shaped structures on the substrate. In this way, the insulating layer formed subsequently may be configured as the shallow trench isolation fully covering the bumps, thereby more effectively isolating two adjacent fin shaped structures from each other to obtain the semiconductor device with better element performance.

Figure 11:
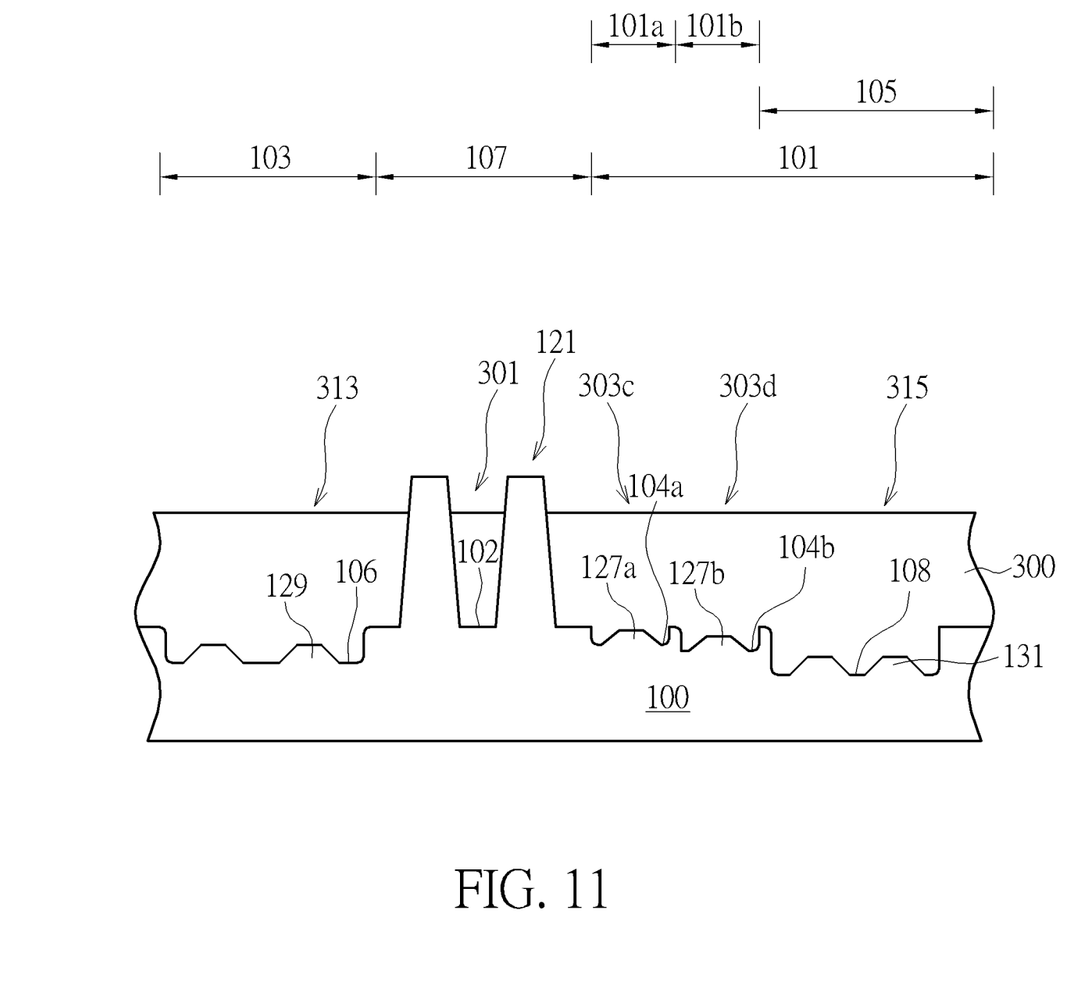
FIG. 11 is a schematic diagram illustrating a method of forming a semiconductor device according to a fifth embodiment of the present invention.

Please refer to FIG. 11, which is a schematic diagram illustrating a method of forming a semiconductor device according to the fifth embodiment of the present invention. The formal steps in the present embodiment are similar to those in the second embodiment, and which includes forming the fin shaped structures 121 on the substrate 100, and forming the surface 104a in the first part 101a of the first region 101, forming the surface 104b in the second part 101b of the first region 101, forming the surface 106 in the second region 103 and the surface 108 in the third region 105. However, the differences between the present embodiment and the aforementioned first embodiment are that, while etching the fin shaped structures 120 in the first region 101 (including the first part 101a and the second part 101b), the second region 103 and the third region 105, the fin shaped structure 120 and the portion of the substrate 100 underneath in the three regions 101, 103, 105 are isotropically etched, so that, at least one bump 127a, 127b, 129, 131 may be formed simultaneously while the surfaces 104a, 104b, 106, 108 are formed, as shown in FIG. 11. Also, after forming the insulating layer 300 in the subsequent process, the insulating layer 300 may fully cover the bumps 127a, 127b, 129, 131 formed in the three regions 101, 103, 105, thereby forming shallow trench isolations 303c, 303d, 313, 315 in the three regions 101, 103, 105 as shown in FIG. 11.

Figure 12:
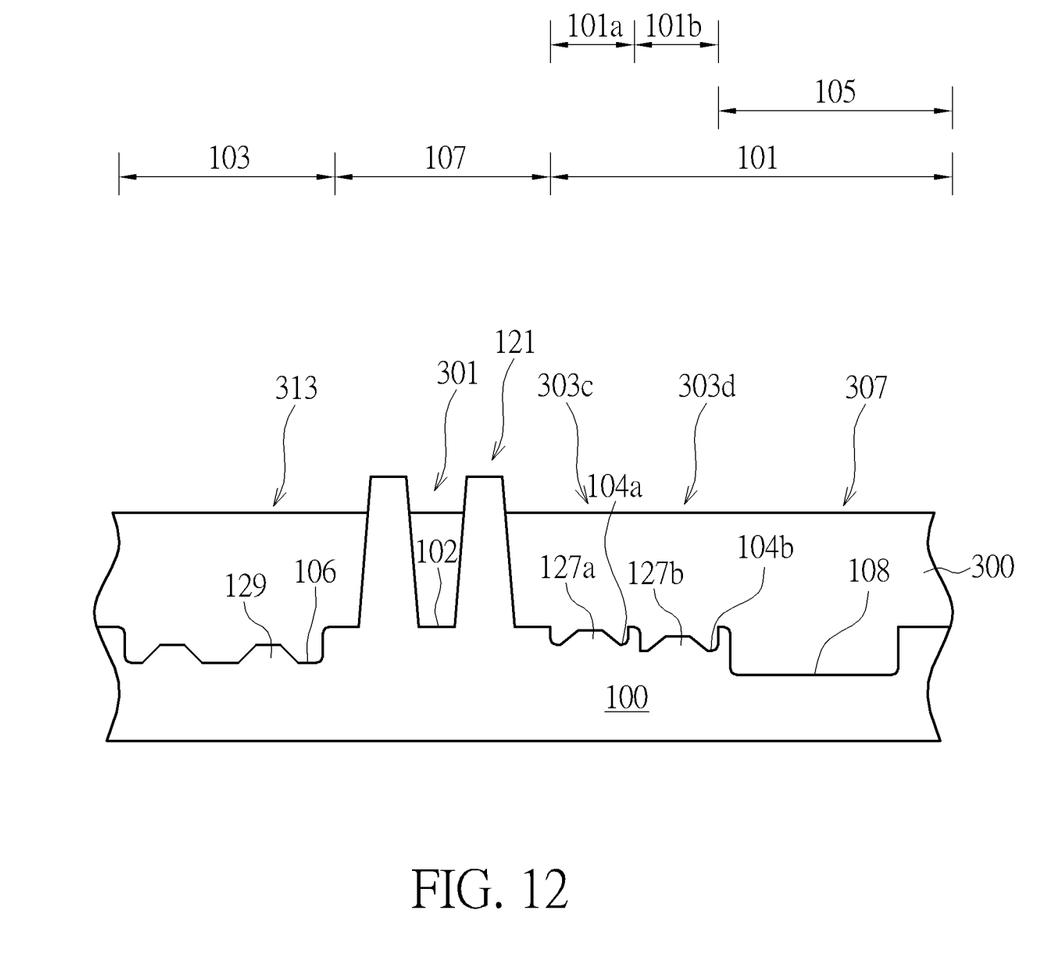
FIG. 12 is a schematic diagram illustrating a method of forming a semiconductor device according to a sixth embodiment of the present invention

Please refer to FIG. 12, which is a schematic diagram illustrating a method of forming a semiconductor device according to the sixth embodiment of the present invention. The formal steps in the present embodiment are similar to those in the fifth embodiment shown in FIG. 11. However, the differences between the present embodiment and the aforementioned fifth embodiment are that, while forming the surface 108 in the third region 105, the fin shaped structures 120, the ODL 160 and the portion of the substrate 100 in the third region 105 may all be synchronously and equally removed, thereby forming the surface 108 in a smooth dishing shaped on the substrate 100 in the third region 105, as shown in FIG. 12. Thus, after forming the insulating layer 300 in the subsequent process, the insulating layer 300 may cover the surfaces 104a, 104b, 106, 108 and the bumps 127a, 127b, 129 formed thereon in the three regions 101, 103, 105, thereby forming shallow trench isolations 303c, 303d, 313, 307 shown in FIG. 12.

Through the above mentioned steps, the semiconductor devices according to the fifth and sixth embodiment of the present invention are obtained. The method of the present invention is also accomplished by performing various fin cut processes with different patterned masks, so as to form various surfaces with different horizontal heights on the substrate. Also, in the present embodiment, the etching conditions are further adjusted to optionally form bumps having a lesser height than that of the fin shaped structures on the surfaces with different horizontal heights. In this way, the insulating layer formed subsequently may be configured as the shallow trench isolation fully covering the bumps, thereby more effectively isolating two adjacent fin shaped structures from each other to obtain the semiconductor device with better element performance.

Overall, the present invention preferably conducts two or more than two fin cut processes after fin-shaped structures are formed on the substrate, so that, the semiconductor device may have dishing surfaces in different horizontal heights, within different regions of the substrate. In addition, since each of the surfaces is obtained through etching a plurality of fin shaped structures, each of the surfaces may have a length being at least two times greater than the pitch of the fin shaped structures. More specifically, the first fin cut process of the present invention preferably forms the first surface having a height in one region, the second fin cut process of the present invention preferably forms the second surface having another height in another region, and further reduce the height of the first surface in a part of the aforementioned region to form the third surface having the least height. In this way, the substrate may obtain at least three dishing surfaces in different horizontal heights. By using the aforementioned approach it would be desirable to prevent unwanted impurities grown on the substrate and damage caused to the entire device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
  a substrate, having a fin field effect transistor (finFET) region, a first region and a second region, the finFET region having a surface, the first region and the second region extending along two different directions and having a first surface and a second surface respectively sunken downwardly from the surface, wherein the first surface is relatively higher than the second surface;

a plurality of bumps disposed on the first surface and the second surface respectively;

a plurality of fin shaped structures, disposed on the surface of the finFET region, wherein the fin shaped structures are extended along a same extending direction of the first region and the surface of the finFET region is coplanar with a base of the fin shaped structures; and an insulating layer, covering the first surface, the second surface, and a bottom portion of the fin shaped structures, to form a first shallow trench isolation (STI) in the first region, a second STI in the second region and a third STI in the finFET region, wherein the first STI, the second STI and the third STI have different depths.

2. The semiconductor device according to claim 1, wherein the first surface and the second surface are lower than the surface of the finFET region.

3. The semiconductor device according to claim 1, wherein a portion of the second region overlaps the first region to define a third region, the third region has a third surface sunken downwardly from the surface, and the insulating layer covers the third surface to form a fourth STI.

4. The semiconductor device according to claim 3, wherein the third surface is relatively lower than the first surface and the second surface.

5. The semiconductor device according to claim 3, wherein the third surface has a length at least two times greater than a pitch of the fin shaped structures.

6. The semiconductor device according to claim 3, wherein a depth of the third STI is less than a depth of the first STI, the depth of the first STI is less than a depth of the second STI, and the depth of the second STI is less than a depth of the fourth STI.

7. The semiconductor device according to claim 1, wherein an extending direction of the second region is perpendicular to the extending direction of the first region and the fin shaped structures, and has a length at least two times greater than a pitch of the fin shaped structures.

8. The semiconductor device according to claim 1, wherein the first surface and the second surface also extend along the two different directions.

9. The semiconductor device according to claim 1, wherein a protruding edge section is disposed between the first surface and the third surface.

10. A method of forming a semiconductor device, comprising:

providing a substrate having a fin field effect transistor (finFET) region, a first region, a second region and a third region, wherein the finFET region has a surface, the first region and the second region extend along two different directions and have a first surface and a second surface respectively sunken downwardly from the surface, the first surface is higher than the second surface, wherein a plurality of bumps are disposed on the first surface and the second surface respectively;

forming a plurality of fin shaped structures on the surface of the finFET region, wherein the fin shaped structures are extended along a same extending direction of the first region and the surface of the finFET region is coplanar with a base of the fin shaped structures; and forming an insulating layer, covering the first surface, the second surface, and a bottom portion of the fin shaped structures, to form a first shallow trench isolation (STI) in the first region, a second STI in the second region, and a third STI in the finFET region, wherein the first STI, the second STI and the third STI have different depths.

* * * * *